United States Patent [19]
Rothermel et al.

[11] Patent Number: 5,559,513
[45] Date of Patent: Sep. 24, 1996

[54] DIGITAL SAMPLING RATE CONVERTER

[75] Inventors: Karin Rothermel; Heinrich Schemmann, both of Villingen-Schwenningen, Germany

[73] Assignee: Deutsche Thomson-Brandt GmbH, Villengen-Schwenningen, Germany

[21] Appl. No.: 287,002

[22] Filed: Aug. 8, 1994

[30] Foreign Application Priority Data

Aug. 6, 1993 [DE] Germany ............................ 43 26 427.1

[51] Int. Cl.$^6$ ............................... G06F 15/31; H03M 3/02
[52] U.S. Cl. ................................. 341/61; 364/724.1
[58] Field of Search ............................. 341/61; 364/724.1

[56] References Cited

U.S. PATENT DOCUMENTS

| | | | |
|---|---|---|---|
| 4,313,173 | 1/1982 | Candy | 364/723 |
| 4,460,890 | 7/1984 | Busby | 340/347 |
| 4,748,578 | 5/1988 | Lagadec | 364/724 |
| 5,159,338 | 10/1992 | Takahashi | 341/61 |

*Primary Examiner*—Jeffrey A. Gaffin
*Assistant Examiner*—Peguy JeanPierre
*Attorney, Agent, or Firm*—Joseph S. Tripoli; Eric P. Herrmann; Ronald H. Kurdyla

[57] ABSTRACT

A sample rate converter includes a first interpolator which generates samples intermediate samples provided at a first sample rate. A second interpolator, using the intermediate samples, generates further samples at a second sample rate which are intermediate the intermediate samples. An accumulator which accumulates a value representing the ratio of the first and second sample rates, generates scale factors for performing the interpolations, and a clock signal at the second sample rate.

5 Claims, 4 Drawing Sheets

DIGITAL SAMPLING RATE CONVERTER

The invention relates to a digital sampling rate converter for the transmission of signals between apparatus using different sampling rates or sampling frequencies or for the digital conversion of the sampling rate of a digital input signal having a first sampling rate into a digital output signal having a second sampling rate.

BACKGROUND OF INVENTION

Apparatus and systems which transmit, process or store audio and/or video signals in digital form are becoming more widespread. In order to be able to effect a signal transmission between different apparatus of this type, a sampling rate converter is required if the apparatus have interfaces which use different sampling rates. In the digital art, the sampling rate or the scanning frequency with which an analogue or else a digital signal is sampled, is one of the most important properties of the system. It indicates how quickly the individual samples succeed each other and it is also referred to as the sampling frequency. In order to capture the full information content of an analogue signal, the sampling frequency is selected, in accordance with the practically proven Shannon sampling theorem, to be at least twice as high as the frequency being measured. Audio signals in the frequency range up to 20 kHz would thus require a sampling frequency of 40 kHz. However, different sampling frequencies were laid down for the individual recording media and methods of transmission. Thus, for example, the sampling frequency amounts to:

44.1 kHz for the compact disc, 48 kHz for digital audio tape and 32 kHz for satellite broadcasting.

A sampling frequency convertor is required when processing the signals of a system using a first sampling frequency, in a system which uses a second sampling frequency, due to the different sampling time points caused by the differing frequencies, in order to provide samples in the raster of the second sampling frequency which correspond as closely as possible to the analogue signal occurring at a particular time point. Basically, two ways are available for this purpose. The digital signal is either converted into an analogue signal and the converted analogue signal is reconverted into a digital signal using a second sampling frequency, or, a conversion is effected at the digital level. However, the conversion of the sampling frequency via an intermediate analogue stage usually leads to a loss in quality and requires expensive D/A and A/D convertors as well as requiring the matching process which is necessary in connection with analogue circuits. One can assume in particular, that the intermediately connected analogue stage and the multiple usage of filters will nullify the essential advantages of digital signal processing, c.f.. KRIEG, Bernhard: Praxis der digitalen Audiotechnik. In: Franzis-Arbeitsbuch 1989, p 33.

Furthermore, methods for the digital conversion of sampling frequencies are known but these can only be realised at relatively high expense and by using a multiplicity of circuits if the ratio between the original frequency and the target frequency is not a whole number. In these cases, a very high intermediate conversion frequency is needed. The realisation of the required filters by calculation of the filter co-efficients represents an especially high outlay since the filters use multiple stages and the number of sets of co-efficients that are necessary grows in proportion to the intermediate frequency.

Furthermore, these methods do not allow different target frequencies to be selected using a single circuit, cf LAGADEC, R.:Digital Sampling Frequency Conversion in Digital Audio, AES Premiere Conference Rey, New York, June 1982.

Consequently, the object of the invention is to provide a method and an arrangement for the digital conversion of sampling frequencies which makes it possible to use a lower intermediate conversion frequency as well as the conversion of different sampling rate ratios for universal application at low cost.

SUMMARY OF THE INVENTION

The principle underlying the method for the digital conversion of the sampling rate of a digital input signal having a first sampling rate into a digital output signal having a second sampling rate is that, the digital output signal having the second sampling rate is formed by a number of first intermediate values of the first sampling rate and second intermediate values, which form the digital output signal, within two first intermediate values. A control signal, which is used both for generating a clock rate for the second sampling rate as well as for controlling a linear interpolator, is preferably formed from the ratio between a second sampling rate and the first sampling rate. This control signal is preferably formed using an accumulator which receives, as an input value, a number that corresponds to the ratio of the second sampling rate to the first sampling rate. For generating a spacing factor for the linear interpolator, the value in the accumulator is combined in a multiplier with an adjustment value which corresponds to the ratio of the first sampling rate to the sampling rate at the output end. Viewed generally, data words of a digital input signal having a first sampling rate are supplied to a digital interpolation filter and a predetermined integral number of first intermediate values is formed by means of the digital interpolation filter. One of the number of first intermediate values corresponding to the predetermined number is then supplied during each clock period of the first sampling rate to a linear interpolator with which a second intermediate value in the raster corresponding to the second sampling rate is determined from two successive first intermediate values. A control signal, which specifies the time point for the provision of the second intermediate value from the ratio between the first sampling rate and the second sampling rate, is formed by means of an interpolator control means as the spacing factor. Furthermore, a clock signal having the second sampling rate is formed by means of a clock generator, from the control signal generated by the interpolator control means.

On an overall view, data words of a digital input signal having a first sampling rate are supplied to a digital interpolation filter and a predetermined integral number of first intermediate values is formed by means of the digital interpolation filter. The input value, together with a predetermined number of intermediate values, is supplied during each clock period of the first sampling rate to a linear interpolator with which a second intermediate value within the raster corresponding to the second sampling rate is determined from two successive first intermediate values. The time point, which is hereby required for the provision of the second intermediate value, is determined from the ratio between the first sampling rate and the second sampling rate, which is represented by a control signal that is generated by means of an interpolator control means. Moreover, this control signal is supplied to a sampling rate clock generator with which a clock rate for the second sampling rate or a multiple thereof is generated. Thereby, the last stage of the digital interpolation filter can be combined in advantageous manner with the linear interpolator and a serial multiplier can be used for the realisation of the linear interpolator. In an arrangement for carrying out the method, the first input of the digital sampling rate converter, which carries the clock rate signal that is a multiple of the first sampling rate, is connected to a digital interpolation filter, an interpolator control means including the means for generating the clock rate that is connected thereto, and also to the interpolator itself. Second and third inputs, which carry input sampling values or data words and a clock rate of the first sampling frequency appertaining thereto, are only connected to the digital interpolation filter.

The numerical value, which is constant in one implementation and which is defined in the digital interpolation filter and in the interpolator control means, determines the number of the first intermediate values. The interpolator control means preferably comprises a phase accumulator, with which, a control signal for a linear interpolator as well as for a clock generator providing the clock rate for the second sampling rate is formed from a numerical value which is calculated from the ratio between the first and second sampling rates in addition to the number of first intermediate values. The linear interpolator can be realised in an advantageous manner by combining the last stage of the digital interpolation filter with a serial multiplier which requires a comparatively smaller outlay.

A digital interpolation filter, which serves for increasing the sampling rate of the input signal by an integral factor, is thus brought into use. In this manner, one achieves an intermediate conversion frequency which preferably and in advantageous manner is increased by an integral factor of 128. Following thereon, a linear interpolator generates second output words which are located in time in the raster of the second sampling rate whereby only two first intermediate values and the time point of the output sampling value which is needed between these values need then be taken into account. In the arrangement for carrying out the method, the means for the generation of the output clock rate or the generation of the second sampling rate is integrated into the circuit arrangement and any arbitrary ratios between output and input clock rates or output sampling rates and input sampling rates can be selected whereby the digital sampling rate converter is utilisable in an advantageous manner for example as a connecting element for digital audio interfaces having different sampling frequencies.

The control signal from the accumulator is used for controlling the interpolator as well as for generating the clock rate at the output end whereby only a relatively low intermediate conversion frequency is required and the output clock rate of the second sampling rate can be transmitted via an AES/EBU interface.

DETAILED DESCRIPTION

Figure 1:
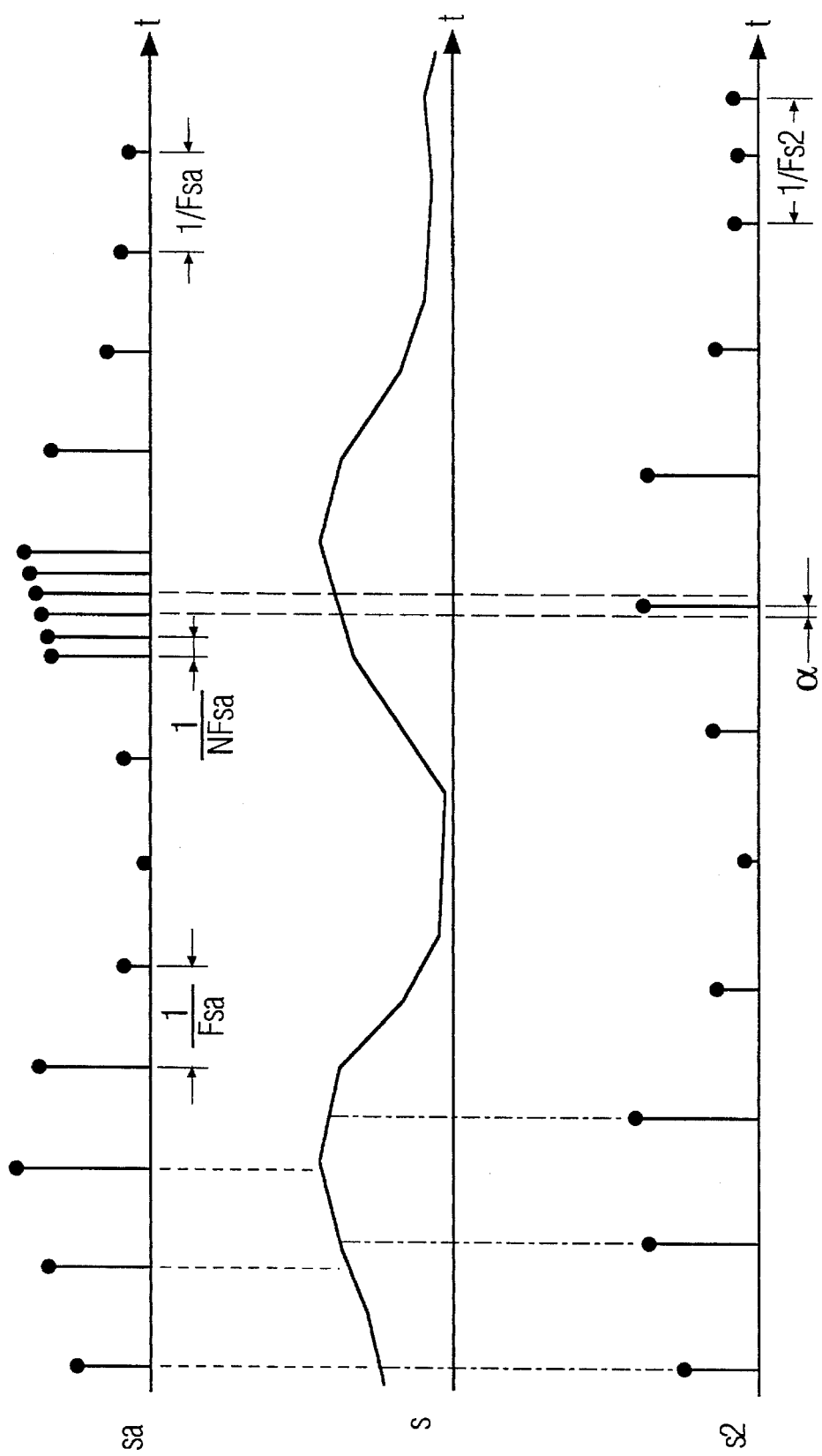
FIG. 1 shows a basic sketch of a scanning sample diagram.
Figure 2:
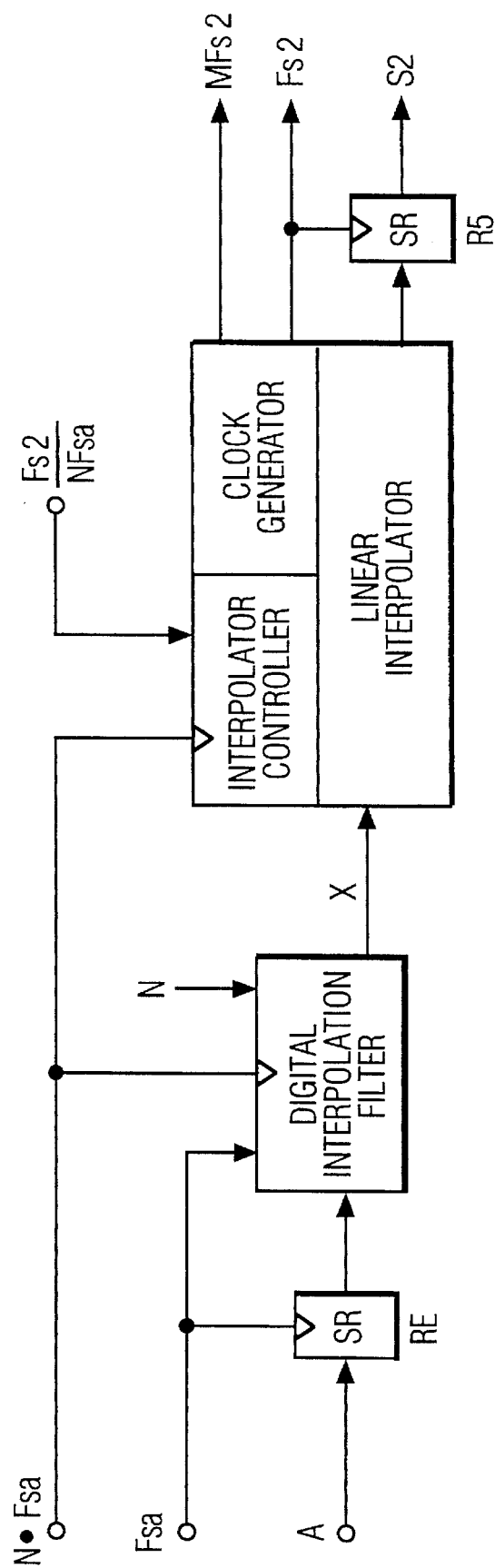
FIG. 2 is a block circuit diagram of a digital sampling rate converter.

In accordance with the scanning sample diagram illustrated in FIG. 1, for the digital conversion of the sampling rate, one has to start from a digital signal which consists of scanning samples sa that occur at a first sampling rate Fsa. These scanning samples sa are taken for example from an analogue signal s which is an audio signal and they are to be converted into a clock raster having a second sampling rate whereby the scanning samples s2 having the second sampling rate should represent the analogue signal s as closely as possible. The second sampling rate has the frequency Fs2. Initially for the digital conversion of the sampling rate, the ratio between the first sampling rate and the second sampling rate is formed or set-up and a laid down or predetermined number N of first intermediate values within the first sampling rate, which corresponds to the wanted resolution, is formed in known manner by means of an interpolation filter DIF which is illustrated in FIG. 2. As is indicated in the basic sketch in accordance with FIG. 1, this leads to first intermediate values X which occur at the Nth multiple of the first sampling frequency Fsa whereby the intermediate values X represent the output data stream of the digital interpolation filter DIF illustrated in FIG. 2. Preferably, an integral multiple of 128 is chosen for the number N. Second intermediate values s2, which are scanning samples s2 of the second sampling rate with the sampling frequency Fs2 i.e. the output sample values, are then formed from two successive first intermediate values X by means of a linear interpolator LIP illustrated in FIG. 2. The second intermediate values s2 are formed in accordance with the relationship $$s2[n]=(1-\alpha)*X[n-1]+\alpha*X[n]$$

whereby the time point, for which a second intermediate value is needed in the raster of the second sampling frequency Fs2, is determined as the spacing number $\alpha$ between zero and one to the directly preceding first intermediate value $X[n-1]$ in an interpolation control means IPC illustrated in FIG. 2 and is supplied to the linear interpolator LIP for generating the second intermediate value $s2[n]$ from two successive first intermediate values $X[n-1]$ and $X[n]$. Since, in accordance with the above mentioned relationship, merely the difference between a first intermediate value $X[n]$ and the preceding first intermediate value $X[n-1]$ as corrected by the factor for the spacing number $\alpha$ has to be taken into account visa vis the first intermediate value $X[n]$, a serial multiplier can be used in an advantageous manner for implementing the method instead of a parallel multiplier as has been necessary up to now. Furthermore, a sampling rate clock generator CG, which provides a clock rate at the second sampling frequency Fs2 and with which an mth multiple of the second sampling frequency Fs2 is simultaneously generated for an AES/EBU interface, is controlled by the interpolator control means IPC. Amongst other things, the special point here, is that it is not the directly available clock rates of the first and second sampling rates which are used as the starting point for the sampling rate conversion, but rather, it is just one clock rate and a numerical value which corresponds to the ratio of the sampling rates that is used.

In accordance with the block circuit diagram of a digital sampling rate converter illustrated in FIG. 2, a fixed number N of first intermediate values X, which amounts for example to 256, is initially formed by means of a digital interpolation filter DIF independently of the ratio between the first and second sampling rates which is to be implemented. To this end, the majority of the circuit sections are driven at a clock rate which corresponds in frequency to the Nth multiple of the first sampling frequency Fsa. The value N has to be taken into account both for the implementation of the digital interpolation filter DIF as well as for an interpolator control means IPC. The interpolator control means IPC is illustrated as a component part of a circuit block which furthermore contains a linear interpolator LIP and a sampling rate clock generator CG, in order to make it abundantly clear that the combining of these component parts is essential for fulfilling the basic principle of the solution and for achieving a low cost. By means of this circuit block, to which the first intermediate values X, a clock rate which corresponds in frequency to the first sampling frequency Fsa multiplied by a number N, and the ratio between the first and second sampling rates Fs2/Fsa are supplied, both a clock rate for the second sampling rate Fs2 as well as second intermediate values s2 are generated as scanning samples in the clock rate raster on the output side.

Figure 3:
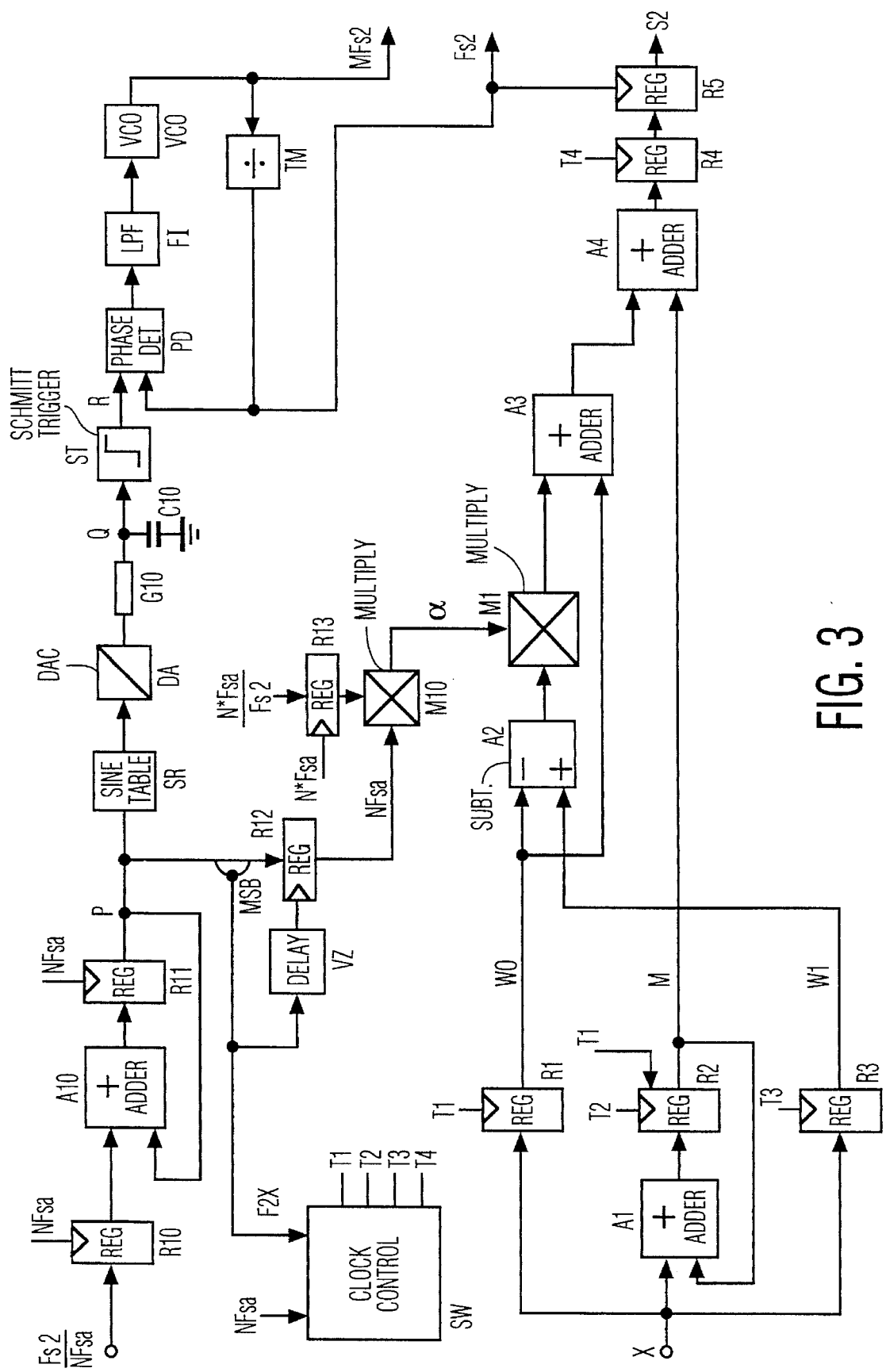
FIG. 3 is a circuit sketch of a circuit block of a digital sampling rate converter.
Figure 5:
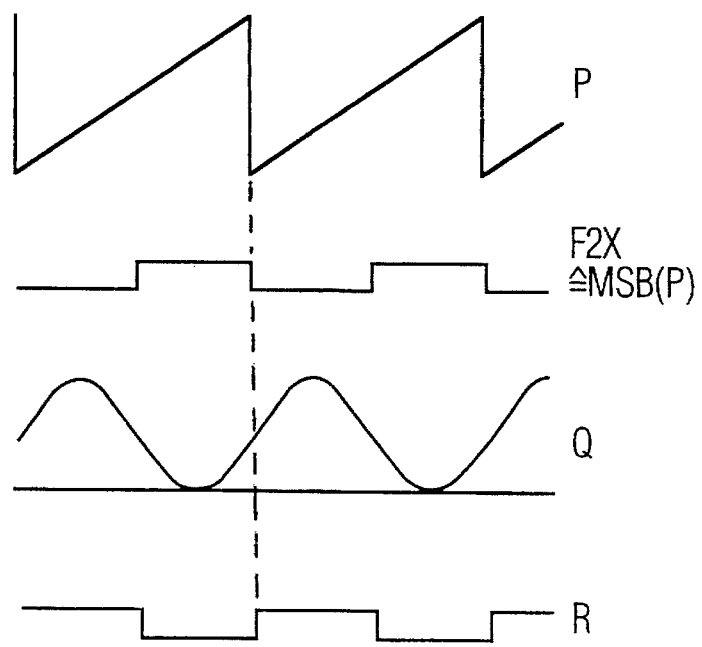
FIG. 5 illustrates signal diagrams for the generation of the output clock rate.

This occurs, as a circuit arrangement of this circuit block illustrated in FIG. 3 shows, at low cost and with high precision since interference is, to a large extent, suppressed and although the ratio between the first and second sampling rates can be freely selected in accordance with the requirements. A comparatively lower number of intermediate values X are needed and a high level of precision in comparison with the original or analogue signal s is achieved. The circuit arrangement corresponding to FIG. 3 of the circuit block illustrated in FIG. 2 contains, in detail, a first register R10, to which the ratio between the second sampling rate Fs2 and the first sampling rate Fsa multiplied by the reciprocal value of the selected number N of first intermediate values of e.g. 256 is supplied. An accumulator, which is formed by an adder A10 and a register R11, is connected to the first register R10. The first register R10 and the register R11 or the accumulator are clocked at the clock rate of the Nth multiple of the first sampling frequency Fsa so that an output value of the accumulator is increased by the value of the first register R10 with each clock pulse. This leads to the accumulator overflowing from time to time and the sequence of values at the output of the accumulator can be regarded as a set of equidistant points on a sawtooth. The value placed in the register R10 then determines the slope of the sawtooth which is illustrated in FIG. 5 and is used as a control signal P for the linear interpolator LIP as well as for a sampling rate clock generator CG that provides the second sampling frequency Fs2. A sequence of clock signals, which are formed by the Most Significant Bit MSB of the control signal P and the clock rate of the multiple of the first sampling frequency N*Fsa, is needed in particular for controlling the linear interpolator LIP. To this end, the Most Significant Bit MSB, which is illustrated as the signal F2X in FIG. 5, is supplied both to a control section SW for generating the clock signals T1 to T4 as well as to the clock input of a register R12 via a delay unit VZ. A central bit field of the word of the control signal P is then transferred into the register R12 connected to the output of the accumulator by a rising edge of the signal F2X which is multiplied by the output signal of a register R13 in a multiplier M10 connected thereto for generating the spacing number $\alpha$. To this end, an adjustment value, which corresponds to the product of Fsa and N divided by Fs2, is supplied to the register R13 which is clocked at the clock rate of the frequency N*Fsa.

Figure 4:
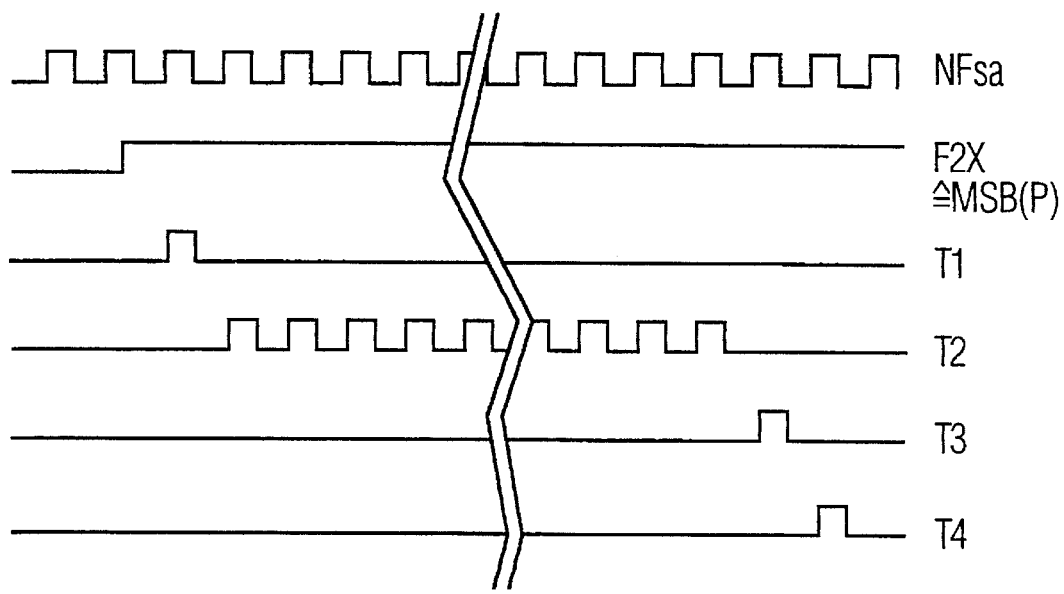
FIG. 4 illustrates clock rate signal diagrams, useful in describing the invention.

The content of R12 is practically the reciprocal of the content of R10. This spacing number $\alpha$ is then used in the linear interpolator LIP for the provision of second intermediate values s2 which correspond to the output values having the second sampling rate. As already mentioned, first intermediate values X are continually supplied to the linear interpolator LIP from the digital interpolation filter DIF. This illustration was chosen for simplicity and to provide a better overall view. It is pertinent that first intermediate values X are made available by the digital interpolation filter DIF whereby, in this embodiment, the last stage of the digital interpolation filter DIF contains an adder A1 and three registers R1, R2, R3 which are illustrated in FIG. 3. The first intermediate values X are directly supplied to an adder A1 and two registers R1, R3 in the last stage of the digital interpolation filter DIF as a sequence of data words having the clock rate of the multiple of the first sampling frequency N*Fsa. With the aid of the clock signal diagram illustrated in FIG. 4, which shows the clock rate of the multiple of the first sampling frequency N*Fsa, the signal F2X as the most significant bit MSB of the phase value P and the clock signals T1 to T4, it is clear that a first intermediate value X, which has a value W0, is stored in the register R1 by the clock signal T1 following a rising edge of the signal F2X. At the same time, the register R2, which is connected after the adder A1 and forms an accumulator therewith, is reset by the clock signal T1. After the clock signal T1, the register R2 is then clocked by the clock signal T2, which consists of 32 pulses for example, whereby, following the end of the clock pulse sequence, a value M is made available at the output of the register R2. The sum of the continuous intermediate values X, which comprise the sequence 2 to 33, is then present in the register R2. After 33 pulses of the clock signals T1 and T2, there then follows a single 34th pulse in the clock signal T3 with which a value W1 is then placed into the register R3. By means of the last stage of the digital interpolation filter DIF, a filter is realised which continuously generates the sum of 33 intermediate values X and which is also referred to as a so-called MTA filter (Moving Time Averager).

The values W0, M and W1 of the intermediate values X are then processed by the linear interpolator LIP, which basically comprises three adders A2, A3, A4 and a serial multiplier M1, in such a way that the value W0 transferred by the clock signal T1 and the value W1 transferred by the clock signal T3 are supplied to the adder A2 to which the serial multiplier M1 is connected for the multiplication by the spacing factor $\alpha$. The output of the serial multiplier M1 is connected to the adder A3 to which the currently occurring value W0 is supplied and, to the output of this adder A3, there is connected the adder A4 with which the values M are added.

The linear interpolator satisfies the following formula.

$$s2[n]=(1-\alpha)*Y[n-1]+\alpha*Y[n]$$

The value X[n] is selected for $\alpha=1$, the value X[n−1] for $\alpha=0$.

Corresponding intermediate values are calculated for values between 0 and 1.

An MTA filter, which calculates a value Y[n] by adding up the last currently received 33 X values, precedes the linear interpolator. Thus, Y[1] could be the sum of X[1] ... X[33]. The next value Y[2] is then the sum of X[2] ... X[34]. One perceives that Y[1] and Y[2] have the X[2] ... X[33] as a common factor. Accordingly, one can remove this factor, to which the signal M in FIG. 3 corresponds, from the blending calculation of the linear interpolator. This then occurs with only X[1] and X[34] to which W0 and W1 in FIG. 3 then correspond. By altering the bracketing in the equation above, the structure in FIG. 3 can then be perceived.

$$s2[n]=W0+\alpha*(W1-W0)+M$$

The second intermediate values s2 formed in this manner are then stored in a register R4 by a clock signal T4 and transferred into a register R5 which is clocked by the second sampling frequency Fs2 or the second sampling rate. The clock signal T4 and the clock rate of the second sampling frequency Fs2 merely differ in phase angle and by a jitter so that the output data word itself remains unaltered by virtue of these measures and is electrically conveyed only to the clock rate system coupled to the sampling raster on the output side.

A signal from an apparatus that still has to be connected is not used directly as the clock rate of the second sampling frequency Fs2, but rather, the clock rate of the second sampling frequency Fs2 is formed in the circuit arrangement from the ratio of the input and output side sampling rates by the control signal P and the input side clock rate N*Fsa. To this end, the sawtoothed control signal P is interpreted in correspondence with FIG. 5 as a phase value in the region from zero to 2 π. In accordance with FIG. 5, this value P is supplied to a sine table SR and the thus resulting sequence of sine values is converted into an analogue voltage which is present on the capacitor C10. For the suppression of high frequency components or for removing interference, an RC low pass filter consisting of G10 and C10 follows the D/A convertor. The phase of this sinusoidal voltage Q is determined by the value P. The frequency results from the value of register R10 and the frequency of the clock rate N*Fsa. A Schmitt-Trigger ST then regenerates a rectangular signal R from the sinusoidal voltage Q, which signal R is now no longer phase discretely coupled to the first sampling frequency Fsa, but rather, it provides the second sampling frequency Fs2. The rectangular signal R is freed from interference by means of a multiplier phase locked loop or PLL which consists of a phase detector PD, a loop filter FI, a voltage controlled oscillator VCO and a divider TM. A clock rate of a multiple of the second sampling frequency Fs2 for supplying an interface is also yielded in advantageous manner by the divider TM. In the case of the rasterised multiplier PLL, the second sampling frequency Fs2 is virtually identical to the rectangular signal R, but, due to the filter effect of the multiplier PLL, is less subject to interference variables.

The digital sampling rate converter described allows, in advantageous manner and at low cost, the conversion of digital sampling rates with a free choice of the output or second sampling rate by the setting or provision of the ratios of the sampling rates using a comparatively relatively low intermediate conversion frequency even for unfavourable sampling rate ratios.

What is claimed is:

1. Sample rate conversion apparatus comprising:

a first interpolator, responsive to samples occurring at a first rate for providing interpolated intermediate samples occurring at a rate N times the first rate where N is an integer greater than one;

means for generating a sampling clock equal to a desired sample rate and for generating a signal representing a scale factor $\alpha$ corresponding to a time difference between the occurrence of one of said intermediate samples and a time of occurrence of a sample at said desired sample rate;

circuitry, including a serial multiplier responsive to said signal representing a scale factor $\alpha$, for combining a first and a $K^{th}$ (a predetermined integer) intermediate samples in proportions (1–$\alpha$) and $\alpha$, to form a combined signal;

an accumulator for accumulating values of intermediate samples between said first and $K^{th}$ intermediate samples to form an intermediate sum signal; and means for adding said combined signal and said intermediate sum signal to form a rate converted signal at said desired sample rate.

2. The apparatus set forth in claim 1, wherein said means for generating a scale factor $\alpha$ comprises:

a further accumulator for incrementing a further sum, at a rate N times the first rate, by the amount equal to the ratio of said desired rate divided by N times the first rate;

means, responsive to a most significant bit of said further sum, for latching at least a portion of said further sum provided by said further accumulator;

a multiplier (M10) for multiplying said further sum by a ratio of N times the first rate divided by said desired rate to form a product corresponding to said scale factor $\alpha$.

3. The apparatus set forth in claim 1, wherein said means for generating a sampling clock equal to said desired sample rate comprises:

a further accumulator for incrementing a further sum, at a rate N times the first rate, by an amount equal to the ratio of said desired rate divided by N times the first rate; and a phase locked loop, responsive to said sum, for generating a clock signal at said desired rate.

4. The apparatus set forth in claim 2, wherein said means for generating a sampling clock equal to said desired sample rate comprises:

a phase locked loop, responsive to said further sum, for generating a clock signal at said desired rate.

5. A method of sample rate conversion comprising:

supplying samples at a first rate;

forming, from samples occurring at said first rate, interpolated intermediate samples occurring at a rate N times the first rate where N is an integer greater than one;

generating a sampling clock equal to a desired sample rate;

generating a signal representing a scale factor $\alpha$ corresponding to a time difference between the occurrence of one of said intermediate samples and a time of occurrence of a sample at said desired sample rate;

scaling and combining a first and a $K^{th}$ (a predetermined integer) intermediate samples in proportions (1–$\alpha$) and $\alpha$ to form a combined signal;

accumulating values of intermediate samples between said first and $K^{th}$ intermediate samples to form an intermediate sum signal; and adding said combined signal and said intermediate sum signal to form a rate converted signal at said desired sample rate.

\* \* \* \* \*